(12) United States Patent
Banerjee et al.

(10) Patent No.: US 11,995,346 B2
(45) Date of Patent: May 28, 2024

(54) RESUMING WRITE OPERATIONS AFTER SUSPENSION

(71) Applicant: Micron Technology, Inc., Boise, ID (US)

(72) Inventors: Amiya Banerjee, Karnataka (IN); Kranthi Kumar Vaidyula, Karnataka (IN); Shreesha Prabhu, Singapore (SG)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 17/884,441

(22) Filed: Aug. 9, 2022

(65) Prior Publication Data
US 2024/0053916 A1 Feb. 15, 2024

(51) Int. Cl.
*G06F 3/06* (2006.01)

(52) U.S. Cl.
CPC .......... *G06F 3/0655* (2013.01); *G06F 3/0604* (2013.01); *G06F 3/0679* (2013.01)

(58) Field of Classification Search
CPC ..... G06F 3/0655; G06F 3/0604; G06F 3/0679
See application file for complete search history.

(56) References Cited

U.S. PATENT DOCUMENTS

| | | | |
|---|---|---|---|
| 2003/0214853 A1* | 11/2003 | Hosono | G11C 16/3463 365/200 |
| 2015/0194220 A1* | 7/2015 | Yang | G11C 16/3436 365/185.12 |
| 2021/0389902 A1* | 12/2021 | Oh | G11C 29/028 |
| 2022/0300179 A1* | 9/2022 | He | G06F 3/0634 |
| 2022/0319618 A1* | 10/2022 | Muzzetto | G11C 16/26 |
| 2022/0404968 A1* | 12/2022 | Zhou | G06F 3/0614 |
| 2023/0205690 A1* | 6/2023 | Yeung | G06F 12/0804 711/154 |
| 2023/0367504 A1* | 11/2023 | Cerafogli | G11C 16/10 |

* cited by examiner

*Primary Examiner* — Sean D Rossiter
(74) *Attorney, Agent, or Firm* — Holland & Hart LLP

(57) ABSTRACT

Methods, systems, and devices for resuming write operation after suspension are described. A memory system may be configured to determine an upper limit of a threshold voltage of a page of a block at which a performance of a write operation was suspended based at least in part on an indication to resume the performance of the write operation that was previously suspended at a memory system; determine a difference between a first quantity of a first logic state stored in the page and a second quantity of the first logic state associated with an unsuspended write operation based at least in part on determining the upper limit of the threshold voltage; and resume the performance of the write operation based at least in part on determining the difference between the first quantity of the first logic state and the second quantity of the first logic state.

25 Claims, 8 Drawing Sheets

RESUMING WRITE OPERATIONS AFTER SUSPENSION

FIELD OF TECHNOLOGY

The following relates to one or more systems for memory, including resuming write operation after suspension.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

A sudden power loss event may occur at a memory system, for example, in response to power being lost suddenly or in response to a device being removed manually from a power source. This may occur while the memory system is performing a write operation, potentially resulting in the write operation being aborted. Some conventional memory systems handle sudden power loss events by aborting all ongoing write operations and transferring data into single level cell (SLC) blocks from the memory cells (e.g., triple level cells (TLCs)) that were aborted. If power resumes, the system may discard the data in the write-aborted pages. The system copies the data from the write-aborted pages to fresh blocks. The system then copies the data (which had been write-aborted) from the SLC blocks to the fresh blocks. This power loss handling technique may delay the power up stage of the device after a sudden power loss event because data that was already written to pages correctly may be re-written to new pages after power is restored. Further, because a write-abort may cause an extra program-erase (PE) cycle on the aborted blocks and may consume an extra PE cycle of the new blocks, this technique can reduce the endurance of the memory system.

Implementations described herein address the aforementioned shortcomings and other shortcomings by providing a memory system that determines the extent of a program during a write-abort condition and provides the information to the system to continue programming on the write-aborted page. This enables resuming of the program on the write-aborted page by reducing copying some of the data after power is restored and operations are resumed. In some examples, the last written page is identified using an erase-page-check feature, and the maximum threshold voltage (Vt max) applied to the write aborted page as part of the write operation is determined. The total number of logic 1 values at the Vt max may be determined. The total number of logic 1 values at the Vt max may be compared with a threshold quantity, which may represent quantity of logic 1 values that occur in a page after a write operation is complete. Based on this comparison, the extent of correctly written logic states in the write aborted block may be determined.

Figure 1:
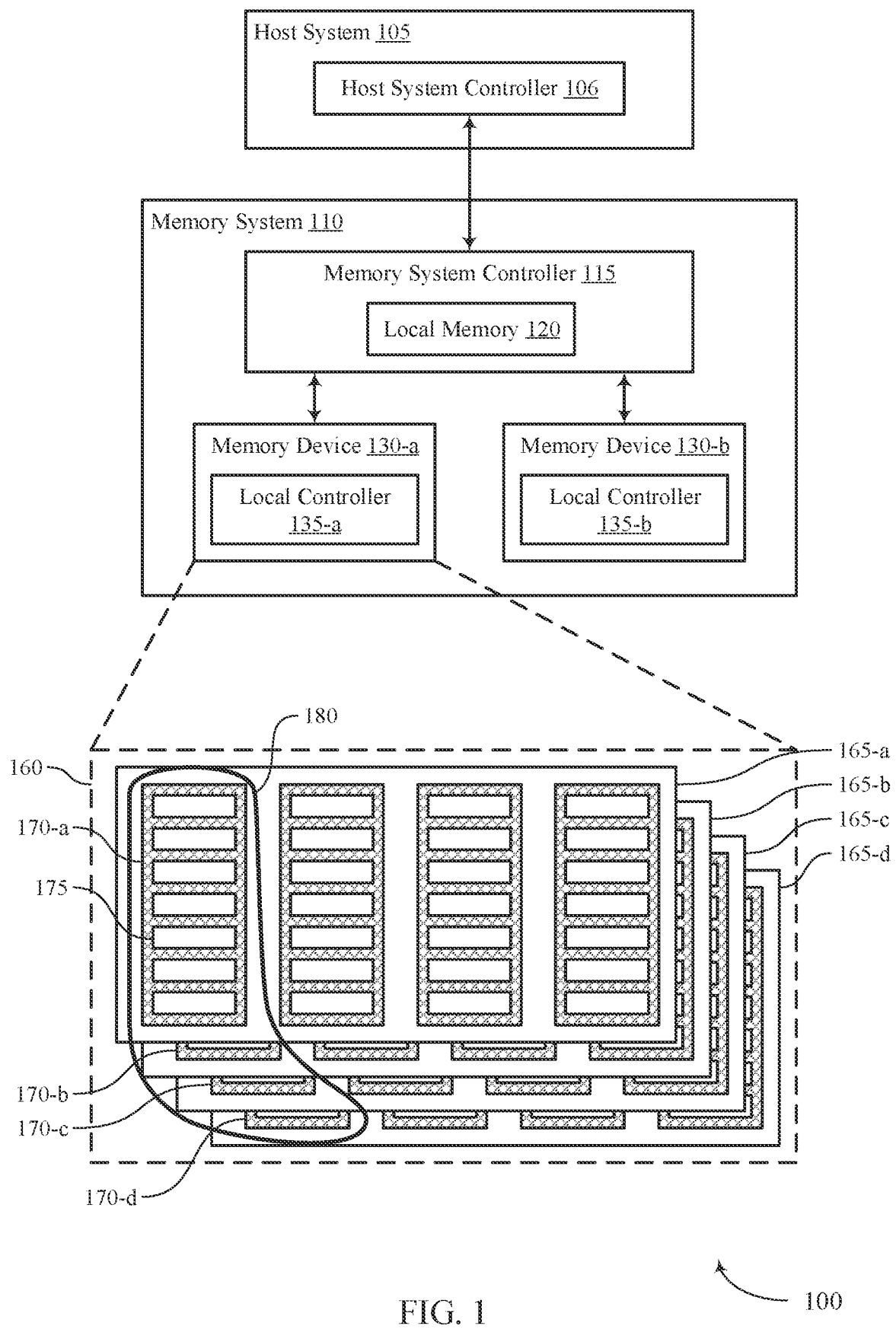
FIG. 1 illustrates an example of a system that supports resuming write operation after suspension in accordance with examples as disclosed herein.
Figure 2:
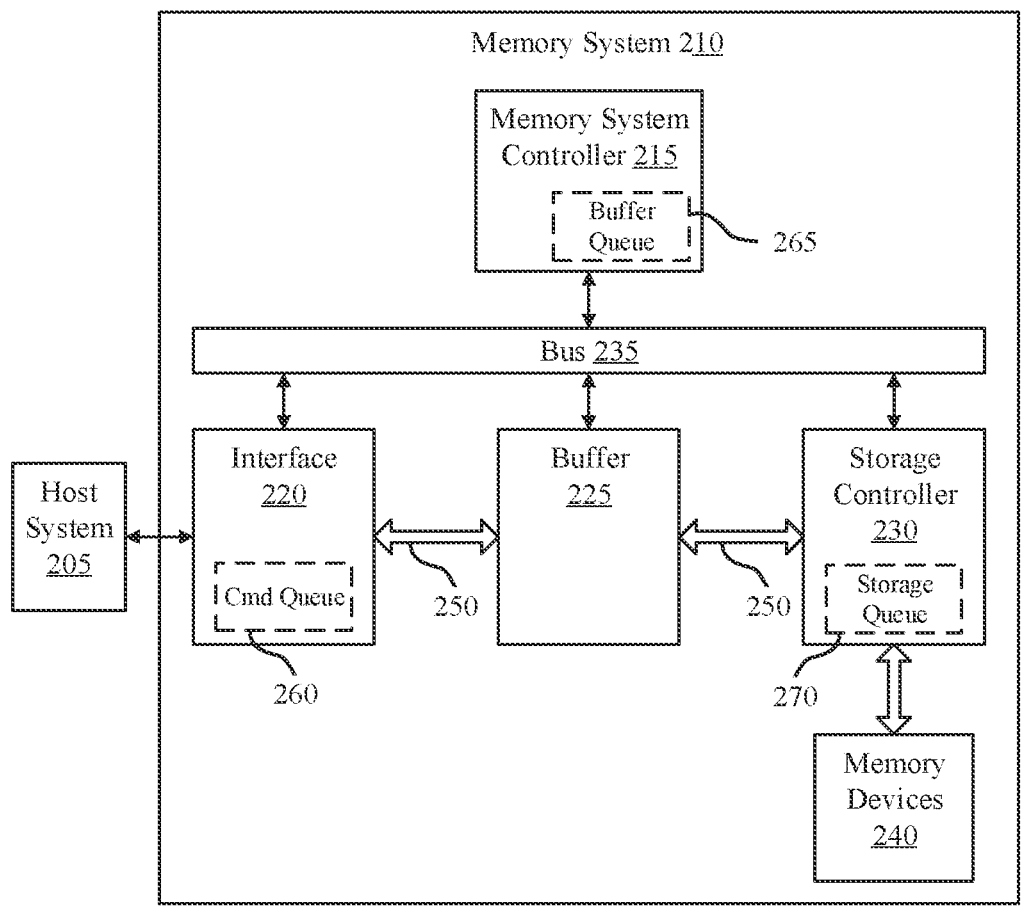
FIG. 2 illustrates an example of a system that supports resuming write operation after suspension in accordance with examples as disclosed herein.

Features of the disclosure are initially described in the context of systems, devices, and circuits with reference to FIGS. 1 and 2. Features of the disclosure are described in the context of determining an extent of a write operation and resuming a write operation after a write-abort event with reference to FIGS. 3 through 6. These and other features of the disclosure are further illustrated by and described in the context of an apparatus diagram and a flowchart that relate to resuming write operation after suspension with reference to FIGS. 7 and 8.

FIG. 1 illustrates an example of a system 100 that supports resuming write operation after suspension in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EE-PROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

The system 100 may include any quantity of non-transitory computer readable media that support resuming write operation after suspension. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described.

In some implementations, the memory system 110 determines the extent of a program during a write-abort condition and provides information regarding the extent of the program to the system 100 to continue the write operation on the write-aborted page. This enables resuming of the program on the write-aborted page by reducing copying some of the data after power is restored and operations are resumed. In some implementations, the last written page may be identified using an erase-page-check feature, and the maximum threshold voltage (Vt max) applied to the write aborted page as part of the write operation is determined. The total number of logic 1 values at the Vt max may be determined. The total number of logic 1 values at the Vt max may be compared with a threshold quantity, which may represent a quantity of logic 1 values that occur in a page after a write operation is complete. Based on this comparison, the extent of correctly written logic states in the write aborted block is determined.

Because the disclosed subject matter does not involve copying data from write-aborted blocks to new blocks, it may facilitate faster return to a power up state of the device after a sudden power loss as compared with some conventional techniques. In addition, because no operations are performed during the power loss event, it may reduce or avoid delays as compared with some conventional techniques. Moreover, the disclosed subject matter may not consume an extra program-erase cycle on the write-aborted blocks and new blocks. Accordingly, there is no impact on device endurance, regardless of the number of sudden power loss events.

FIG. 2 illustrates an example of a system 200 that supports resuming write operation after suspension in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point or other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed herein. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the described operations in conjunction with or instead of the memory system controller 215. In some cases, the memory system controller 215 may perform the functions of the storage controller 230 and the storage controller 230 may be omitted.

In some implementations, the memory system controller 215 may determine the extent of a program during a write-abort condition and provides information regarding the extent of the program to the memory system 210 to continue the write operation on the write-aborted page. This enables resuming of the program on the write-aborted page by reducing copying some of the data after power is restored and operations are resumed. In some implementations, the last written page may be identified using an erase-page-check feature, and the maximum threshold voltage (Vt max) applied to the write aborted page as part of the write operation is determined. The total number of logic 1 values at the Vt max may be determined. The total number of logic 1 values at the Vt max may be compared with a threshold quantity, which may represent a quantity of logic 1 values that occur in a page after a write operation is complete. Based on this comparison, the extent of correctly written logic states in the write aborted block is determined.

Because the disclosed subject matter does not involve copying data from write-aborted blocks to new blocks, it may facilitate faster return to a power up of the device state after a sudden power loss as compared with some conventional techniques. In addition, because no operations are performed during the power loss event, it may reduce or avoid delays as compared with some conventional techniques. Moreover, the disclosed subject matter may not consume an extra program-erase cycle on the write-aborted blocks and new blocks. Accordingly, there is no impact on device endurance, regardless of the number of sudden power loss events.

Figure 3:
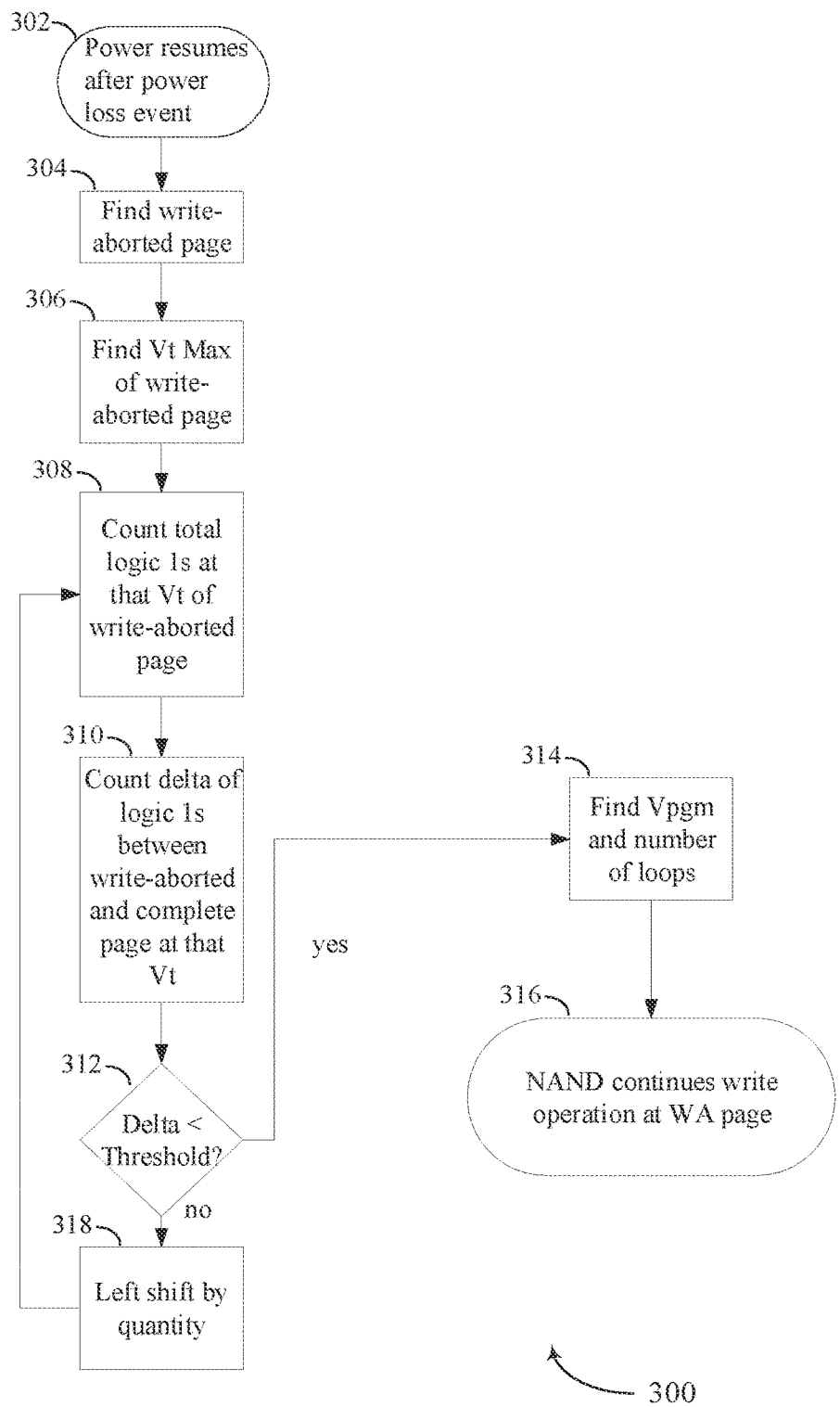
FIG. 3 illustrates an example method that supports resuming write operation after suspension in accordance with examples as disclosed herein.

FIG. 3 illustrates an example method 300 for detecting an extent of programming for write-abort and continuation of program on a write-aborted page that supports resuming write operation after suspension in accordance with examples as disclosed herein. As represented at block 302, a power loss event may occur and the memory system may resume power after the power loss event. In some implementations, as represented at block 304, the method 300 may include finding a write-aborted page, e.g., the last written page of a block being written at the time the power loss event occurs. For example, the last written page may be identified using an erase-page-check feature.

As represented by block 306, in some implementations, a maximum threshold voltage Vt Max of the write-aborted page may be found. Some memory systems write data to the cells by writing different logic states to a page. For example, a memory system (that uses TLC) may write a state that corresponds to logic state '000' into the various memory cells. Later, the memory system may write different states that correspond to other logic states. By finding the maximum threshold voltage written into the page, the memory system may identify an estimate of a position that the write operation was aborted.

As represented by block 308, a total quantity of logic 1 values that occur at that Vt of the write-aborted page may be counted. This determination may refine the memory system's estimate of the position that the write operation was aborted. As represented by block 310, this quantity may be compared with another quantity of logic 1 values that occur at the same Vt for a complete programmed page that may be used as a reference page. For example, a certain quantity of logic 1 values at a voltage level may be expected to be programmed into the block based on characterizations of writing data into the memory system. The quantity of logic 1 values in the block may be compared with an expected value of logic 1 values. This comparison may provide more granular information about the location that the write operation was aborted.

In some implementations, as represented by block 312, the difference, or delta, between a first quantity of logic 1 values for the write-aborted page and a second expected quantity of logic 1 values the complete programmed page may be compared to a threshold (e.g., 40000). If the difference is less than the threshold, a write voltage Vpgm and a quantity of loops that was completed before the write operation was suspended may be determined, as represented by block 314. The write voltage Vpgm and/or the quantity of loops may be determined based at least in part on reference data derived from a characterization of the memory system. This information may be sent to the memory system. In some implementations, the memory system may send this information to the memory device (e.g., NAND memory). As represented by block 316, the memory device may then resume performing the write operation at the write-aborted page with a first offset and/or a second offset. For example, a first offset X may be associated with the write voltage Vpgm to apply in response to resuming the write operation. A second offset Y may be associated with the quantity of loops to apply in response to resuming the write operation. The offsets X and Y may be based at least in part on the difference between a first quantity of logic 1 values for the write aborted page and a second expected quantity of logic 1 values for the complete programmed page being less than the threshold difference (e.g., 40000). In some implementations, the performance of the write operation may be resumed using the first offset X and the second offset Y (e.g., {Vpgm_base+X, number of loops−Y}). In some implementations, the offsets X and Y may be based on a characteristic associated with the memory system.

In some implementations, as represented by block 322, if the difference is greater than or equal to the threshold, the system may continue to find the cliff point of the write-aborted page. For example, a voltage amount may be decreased (e.g., decreasing the value of Vt by 500 mV, which may be referred to as a leftward shift) may be applied, and the processes represented by blocks 308, 310, and 312 may be repeated.

Figure 4:
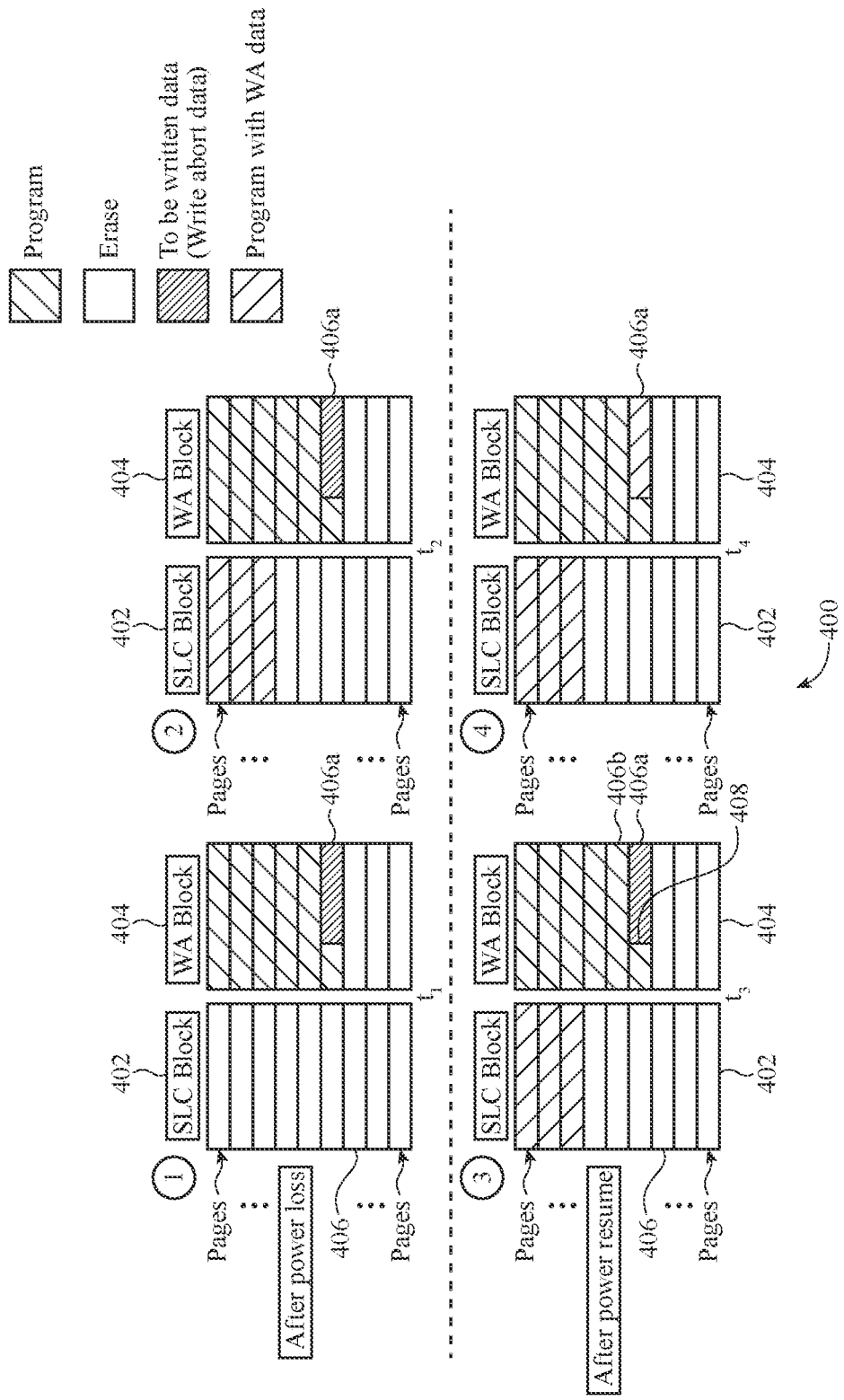
FIG. 4 illustrates an example memory system that supports resuming write operation after suspension in accordance with examples as disclosed herein.

FIG. 4 illustrates an example memory system 400 configured to handle a sudden power loss event that supports resuming write operation after suspension in accordance with examples as disclosed herein. The example memory system 400 includes memory units logically organized into blocks 402, 404, each of which comprises a number of pages 406. As illustrated in FIG. 4, at a time t1, a write-abort event may occur, e.g., due to a sudden power loss. The write-abort event may cause a write operation to block 404 to be interrupted at a page 406a. At a time t2, the memory system 400 may abort ongoing programming operations and flush data to be written into block 404 to a SLC) block, such as block 402. If the block 404 is a TLC block, then the data write to the SLC block at block 402 may be take triple the quantity of memory cells to store. The memory system may flush data from the buffer into SLC blocks because SLC writes may be faster and more reliable than TLC writes and may be capable of being completed before power is lost completely, in some cases.

During the power loss event, no operations may be performed by the memory system 400, in some examples. At a time t3, after power is restored, the memory system 400 may perform the process described herein in connection with FIG. 3 to determine the extent to which the write operation was completed before the write-abort event (e.g., determine the location 408 that the write operation was aborted). For example, a maximum threshold voltage Vt Max of the write-aborted page 406a may be found. A total quantity of logic 1 values that occur at that Vt of the write-aborted page 406a may be counted. This quantity may be compared with another quantity of logic 1 values that occur at the same Vt for a complete programmed page, e.g., a page 406b.

The difference, or delta, between a first quantity of logic 1 values for the write-aborted page 406a and a second expected quantity of logic 1 values for the complete programmed page 406b may be compared to a threshold (e.g., 40000). If the difference is less than the threshold, a write voltage Vpgm and a quantity of loops that was completed before the write operation was suspended may be determined. The write voltage Vpgm and/or the quantity of loops may be determined based at least in part on reference data derived from a characterization of the memory system. This information may be sent to the system. In some implementations, the system may send this information to the memory. At a time t4, the memory may then resume performing the write operation at the write-aborted page with a first offset and/or a second offset. For example, a first offset X may be associated with the write voltage Vpgm to apply in response to resuming the write operation. A second offset Y may be associated with the quantity of loops to apply in response to resuming the write operation. The offsets X and Y may be based at least in part on the difference between the first quantity of logic 1 values for the write-aborted page and a second expected quantity of logic 1 values for the complete programmed page being less than the threshold difference (e.g., 40000). In some implementations, the performance of the write operation may be resumed using the first offset X and the second offset Y. In some implementations, the offsets X and Y may be based on a characteristic associated with the memory system.

Figure 5:
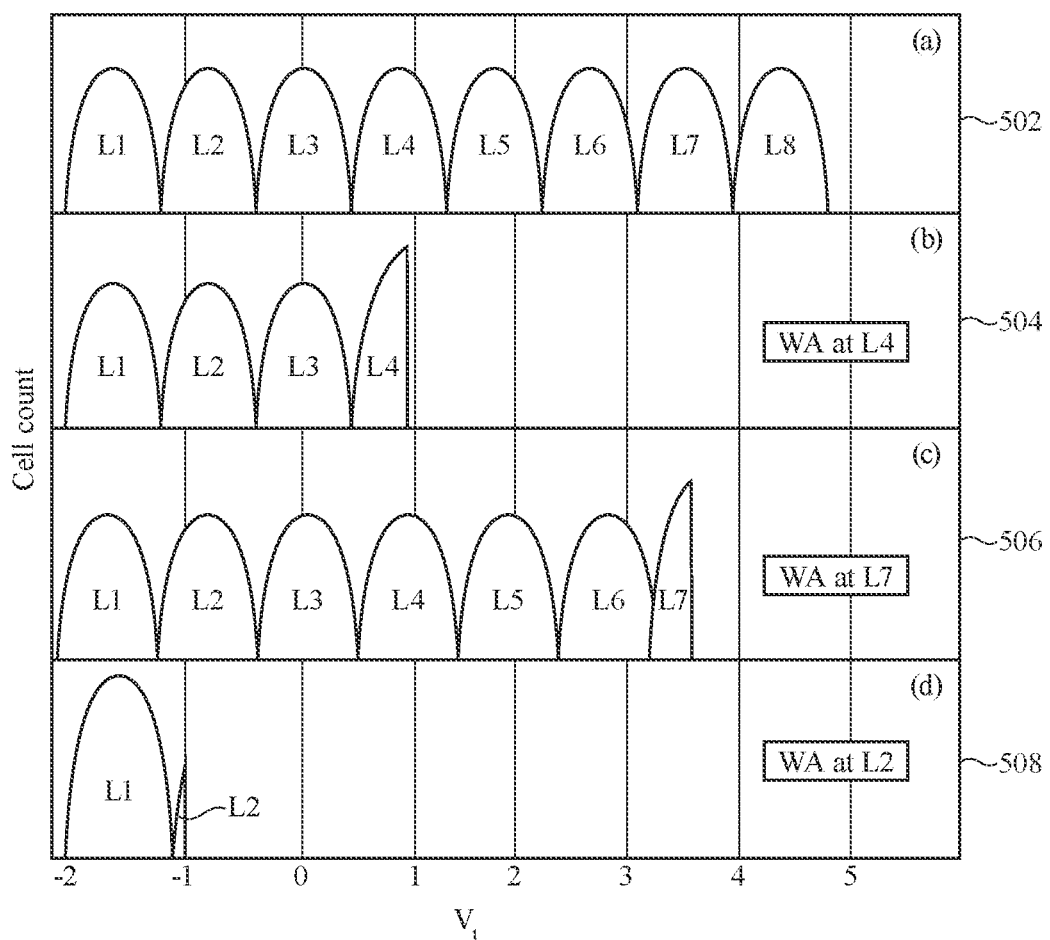
FIG. 5 illustrates example cell voltage distributions of a triple-level cell program with various degrees of completeness that supports resuming write operation after suspension in accordance with examples as disclosed herein.

FIG. 5 illustrates example cell voltage distributions of a triple-level cell (TLC) program with various degrees of completeness that supports resuming write operation after suspension in accordance with examples as disclosed herein. For example, a voltage distribution 502 may represent a complete programmed page reference, which may represent a complete TLC program that may be used as a reference. In the voltage distribution 502, states L1, L2, L3, L4, L5, L6, L7, and L8 may represent eight different memory states (e.g., corresponding to three bits of data stored by a TLC) that may be stored in a TLC cell, which may correspond to eight different threshold voltages of a completed write operation. The states L1-L8 may be mapped to any logic states (e.g., L1 may map to '000' or '111' or any other logic state). A voltage distribution 504 may represent an operation that was write-aborted at level 4. A voltage distribution 506 may represent an operation that was write-aborted at level 7. A voltage distribution 508 may represent an operation that was write-aborted at the beginning of a write operation (e.g., level 2). Level 1 may correspond to erase distribution. Portions of the figure show that different amounts of a state may be written. The memory system may determine the maximum voltage threshold (e.g., the state) at which the write operation was aborted, such as L4 in 504, L7 in 506, or L2 in 508. The memory system may also determine are early or late in the process of writing the state the write operation was aborted by determining the quantity of logic 1 values at that threshold voltage (e.g., the quantity of logic 1 values written in the block for the L4 level for the distribution 504).

Figure 6:
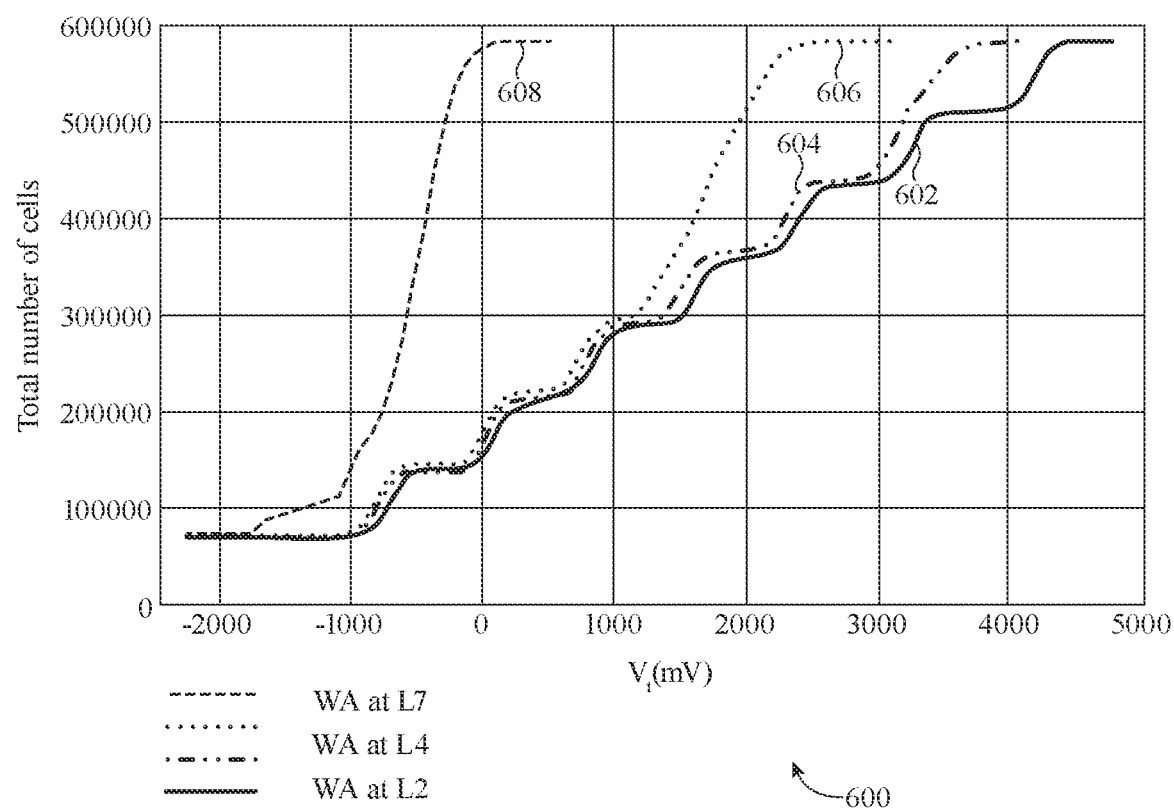
FIG. 6 illustrates an example of the total number of logic 1 values at different threshold voltages for write aborted conditions shown in FIG. 5 that supports resuming write operation after suspension in accordance with examples as disclosed herein.

FIG. 6 illustrates an example of the total number of logic 1 values 600 at different threshold voltages for write-aborted conditions for the write-abort conditions shown in FIG. 5 that supports resuming write operation after suspension in accordance with examples as disclosed herein. As illustrated in FIG. 6, there may be a significant difference between a first quantity of logic 1 values written in write-aborted pages (e.g., as shown with curves 604, 606, and 608) and a second quantity of logic 1 values written in a completed page (e.g., the right-most curve in FIG. 6, curve 602).

The y-axis of the graph in FIG. 6 represents the total number of memory cells that store a logic 1 value. The x-axis of the graph in FIG. 6 represents a threshold voltage written in the memory cells. In response to a write operation being aborted, the remaining portions of a write-aborted page may be written to logic 1 values. For example, the curve immediately to the left of curve 602, curve 604, represents a write-aborted page that was aborted at L7 level, at which time the quantity of logic 1 values in the write abort page gets higher, directly after the aborting of the write operation. The curve immediately to the left of curve 604, curve 606, represents a write-aborted page that was aborted at L4 level, at which time the quantity of logic 1 values in the write abort page gets higher, directly after the aborting of the write operation. The left-most curve, curve 608, represents a write-aborted page that was aborted at L2 level, at which time the quantity of logic 1 values in the write abort page gets higher, directly after the aborting of the write operation.

In some cases, all of the states may have an equal number of cells, and this can be observed in the case of the curve 602 that represents the page that is completely written. However, in the case of a write-abort event, cells that are to be written to the higher states still have a lower threshold voltage. Accordingly, at the write-aborted instance (e.g., threshold voltage), a larger quantity of cells may be identified as having logic 1 values than the quantity of cells that have a logic 1 value in a page that is completely written.

Figure 7:
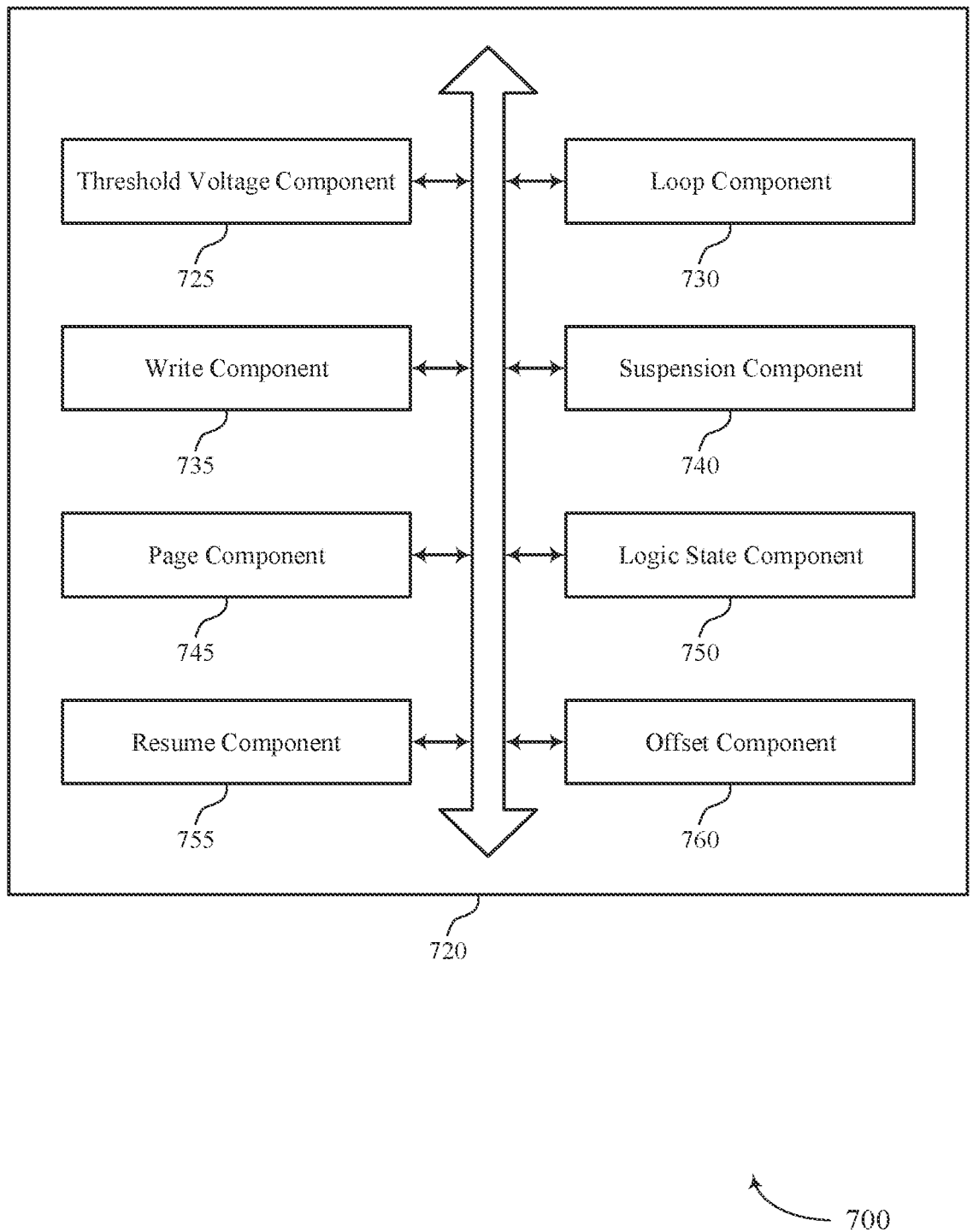
FIG. 7 shows a block diagram of a memory system that supports resuming write operation after suspension in accordance with examples as disclosed herein.

FIG. 7 shows a block diagram 700 of a memory system 720 that supports resuming write operation after suspension in accordance with examples as disclosed herein. The memory system 720 may be an example of aspects of a memory system as described with reference to FIGS. 1 through 6. The memory system 720, or various components thereof, may be an example of means for performing various aspects of resuming write operation after suspension as described herein. For example, the memory system 720 may include a threshold voltage component 725, a loop component 730, a write component 735, a suspension component 740, a page component 745, a logic state component 750, a resume component 755, an offset component 760, or any combination thereof. Each of these components may communicate, directly or indirectly, with one another (e.g., via one or more buses).

The threshold voltage component 725 may be configured as or otherwise support a means for determining an upper limit of a threshold voltage of a page of a block at which a performance of a write operation was suspended based at least in part on an indication to resume the performance of the write operation that was previously suspended at a memory system. The loop component 730 may be configured as or otherwise support a means for determining a difference between a first quantity of a first logic state stored in the page and a second quantity of the first logic state associated with an unsuspended write operation based at least in part on determining the upper limit of the threshold voltage. The write component 735 may be configured as or otherwise support a means for resuming the performance of the write operation based at least in part on determining the difference between the first quantity of the first logic state and the second quantity of the first logic state.

In some examples, the suspension component 740 may be configured as or otherwise support a means for identifying a second indication to suspend the performance of the write operation at the memory system. In some examples, the suspension component 740 may be configured as or otherwise support a means for suspending the performance of the write operation based at least in part on identifying the indication to suspend the performance, where determining the upper limit is based at least in part on suspending the performance. In some examples, the second indication corresponds to a power loss.

In some examples, the page component 745 may be configured as or otherwise support a means for determining the page of the block at which the performance of the write operation was suspended, where determining the upper limit is based at least in part on determining the page.

In some examples, the logic state component 750 may be configured as or otherwise support a means for determining the first quantity of the first logic state stored in the page based at least in part on determining the upper limit of the threshold voltage, where determining the difference is based at least in part on determining the first quantity.

In some examples, the logic state component 750 may be configured as or otherwise support a means for comparing the difference between the first quantity of the first logic state stored in the page and the second quantity of the first logic state associated with the unsuspended write operation with a threshold difference, where resuming the performance of the write operation is based at least in part on the comparison.

In some examples, to support resuming the performance of the write operation, the resume component 755 may be configured as or otherwise support a means for determining a write voltage and a quantity of loops completed before the write operation was suspended based at least in part on the difference between the first quantity and the second quantity being less than the threshold difference.

In some examples, the resume component 755 may be configured as or otherwise support a means for determining at least one of the write voltage or the quantity of loops completed before the write operation was suspended based at least in part on reference data derived from a characterization of the memory system.

In some examples, to support resuming the performance, the suspension component 740 may be configured as or otherwise support a means for providing the write voltage and the quantity of loops completed before the write operation was suspended to the memory system based at least in part on the difference between the first quantity and the second quantity being less than the threshold difference.

In some examples, to support resuming the performance of the write operation, the suspension component 740 may be configured as or otherwise support a means for providing the write voltage and the quantity of loops completed before the write operation was suspended to a nonvolatile memory device of the memory system based at least in part on the difference between the first quantity and the second quantity being less than the threshold difference.

In some examples, determining a first offset associated with the write voltage to apply in response to resuming the write operation and a second offset associated with the quantity of loops to apply in response to resuming the write operation based at least in part on the difference between the first quantity and the second quantity being less than the threshold difference. In some examples, where resuming the performance of the write operation further includes: resuming the performance of the write operation at the page using the first offset and the second offset. In some examples, the first offset and the second offset are based on a characteristic associated with the memory system.

In some examples, to support resuming the performance of the write operation, the logic state component 750 may be configured as or otherwise support a means for determining a third quantity of the first logic state stored in the page based at least in part on determining that a voltage is less than the upper limit of the threshold voltage based at least in part on the difference between the first quantity and the second quantity being greater than the threshold difference.

In some examples, to support resuming the performance, the logic state component 750 may be configured as or otherwise support a means for determining a second difference between the first quantity of the first logic state stored in the page and the third quantity of the first logic state based at least in part on the difference between the first quantity and the second quantity being greater than the threshold difference.

Figure 8:
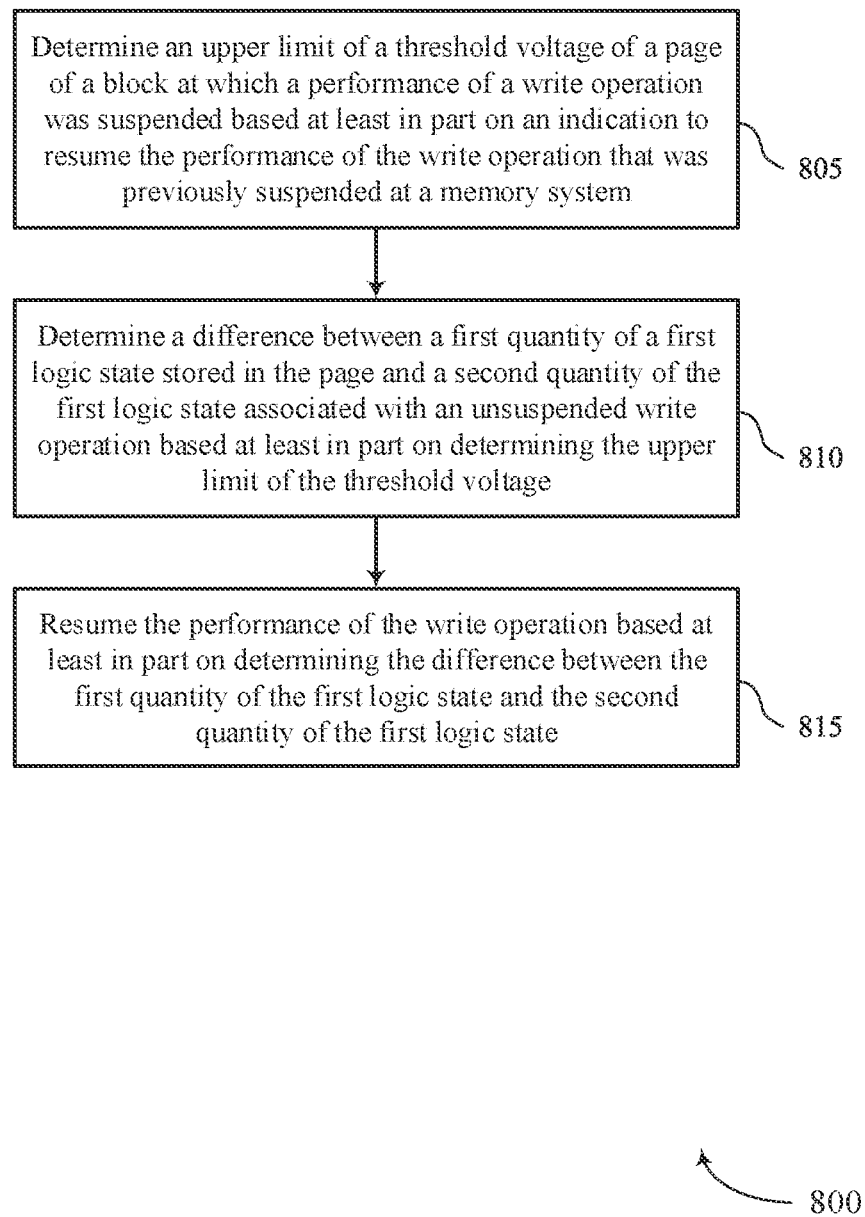
FIG. 8 shows a flowchart illustrating a method or methods that support resuming write operation after suspension in accordance with examples as disclosed herein.

FIG. 8 shows a flowchart illustrating a method 800 that supports resuming write operation after suspension in accordance with examples as disclosed herein. The operations of method 800 may be implemented by a memory system or its components as described herein. For example, the operations of method 800 may be performed by a memory system as described with reference to FIGS. 1 through 7. In some examples, a memory system may execute a set of instructions to control the functional elements of the device to perform the described functions. Additionally, or alternatively, the memory system may perform aspects of the described functions using special-purpose hardware.

At 805, the method may include determining an upper limit of a threshold voltage of a page of a block at which a performance of a write operation was suspended based at least in part on an indication to resume the performance of the write operation that was previously suspended at a memory system. The operations of 805 may be performed in accordance with examples as disclosed herein. In some examples, aspects of the operations of 805 may be performed by a threshold voltage component 725 as described with reference to FIG. 7.

At 810, the method may include determining a difference between a first quantity of a first logic state stored in the page and a second quantity of the first logic state associated with an unsuspended write operation based at least in part on determining the upper limit of the threshold voltage. The operations of 810 may be performed in accordance with examples as disclosed herein. In some examples, aspects of the operations of 810 may be performed by a loop component 730 as described with reference to FIG. 7.

At 815, the method may include resuming the performance of the write operation based at least in part on determining the difference between the first quantity of the first logic state and the second quantity of the first logic state.

The operations of 815 may be performed in accordance with examples as disclosed herein. In some examples, aspects of the operations of 815 may be performed by a write component 735 as described with reference to FIG. 7.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for determining an upper limit of a threshold voltage of a page of a block at which a performance of a write operation was suspended based at least in part on an indication to resume the performance of the write operation that was previously suspended at a memory system; determining a difference between a first quantity of a first logic state stored in the page and a second quantity of the first logic state associated with an unsuspended write operation based at least in part on determining the upper limit of the threshold voltage; and resuming the performance of the write operation based at least in part on determining the difference between the first quantity of the first logic state and the second quantity of the first logic state.

Aspect 2: The method, apparatus, or non-transitory computer-readable medium of aspect 1, further including operations, features, circuitry, logic, means, or instructions, or any combination thereof for identifying a second indication to suspend the performance of the write operation at the memory system and suspending the performance of the write operation based at least in part on identifying the indication to suspend the performance, where determining the upper limit is based at least in part on suspending the performance.

Aspect 3: The method, apparatus, or non-transitory computer-readable medium of aspect 2 where the second indication corresponds to a power loss.

Aspect 4: The method, apparatus, or non-transitory computer-readable medium of any of aspects 1 through 3, further including operations, features, circuitry, logic, means, or instructions, or any combination thereof for determining the page of the block at which the performance of the write operation was suspended, where determining the upper limit is based at least in part on determining the page.

Aspect 5: The method, apparatus, or non-transitory computer-readable medium of any of aspects 1 through 4, further including operations, features, circuitry, logic, means, or instructions, or any combination thereof for determining the first quantity of the first logic state stored in the page based at least in part on determining the upper limit of the threshold voltage, where determining the difference is based at least in part on determining the first quantity.

Aspect 6: The method, apparatus, or non-transitory computer-readable medium of any of aspects 1 through 5, further including operations, features, circuitry, logic, means, or instructions, or any combination thereof for comparing the difference between the first quantity of the first logic state stored in the page and the second quantity of the first logic state associated with the unsuspended write operation with a threshold difference, where resuming the performance of the write operation is based at least in part on the comparison.

Aspect 7: The method, apparatus, or non-transitory computer-readable medium of aspect 6 where resuming the performance of the write operation includes operations, features, circuitry, logic, means, or instructions, or any combination thereof for determining a write voltage and a quantity of loops completed before the write operation was suspended based at least in part on the difference between the first quantity and the second quantity being less than the threshold difference.

Aspect 8: The method, apparatus, or non-transitory computer-readable medium of aspect 7, further including operations, features, circuitry, logic, means, or instructions, or any combination thereof for determining at least one of the write voltage or the quantity of loops completed before the write operation was suspended based at least in part on reference data derived from a characterization of the memory system.

Aspect 9: The method, apparatus, or non-transitory computer-readable medium of any of aspects 7 through 8 where resuming the performance, further includes operations, features, circuitry, logic, means, or instructions, or any combination thereof for providing the write voltage and the quantity of loops completed before the write operation was suspended to the memory system based at least in part on the difference between the first quantity and the second quantity being less than the threshold difference.

Aspect 10: The method, apparatus, or non-transitory computer-readable medium of any of aspects 7 through 9 where resuming the performance of the write operation, further includes operations, features, circuitry, logic, means, or instructions, or any combination thereof for providing the write voltage and the quantity of loops completed before the write operation was suspended to a nonvolatile memory device of the memory system based at least in part on the difference between the first quantity and the second quantity being less than the threshold difference.

Aspect 11: The method, apparatus, or non-transitory computer-readable medium of any of aspects 7 through 10 where determining a first offset associated with the write voltage to apply in response to resuming the write operation and a second offset associated with the quantity of loops to apply in response to resuming the write operation based at least in part on the difference between the first quantity and the second quantity being less than the threshold difference and where resuming the performance of the write operation further includes: resuming the performance of the write operation at the page using the first offset and the second offset.

Aspect 12: The method, apparatus, or non-transitory computer-readable medium of aspect 11 where the first offset and the second offset are based on a characteristic associated with the memory system.

Aspect 13: The method, apparatus, or non-transitory computer-readable medium of any of aspects 7 through 12 where resuming the performance of the write operation, further includes operations, features, circuitry, logic, means, or instructions, or any combination thereof for determining a third quantity of the first logic state stored in the page based at least in part on determining that a voltage is less than the upper limit of the threshold voltage based at least in part on the difference between the first quantity and the second quantity being greater than the threshold difference.

Aspect 14: The method, apparatus, or non-transitory computer-readable medium of aspect 13 where resuming the performance, further includes operations, features, circuitry, logic, means, or instructions, or any combination thereof for determining a second difference between the first quantity of the first logic state stored in the page and the third quantity of the first logic state based at least in part on the difference between the first quantity and the second quantity being greater than the threshold difference.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
    a controller associated with a memory device, wherein the controller is configured to cause the apparatus to:
        determine an upper limit of a threshold voltage of a page of a block at which a performance of a write operation was suspended based at least in part on an indication to resume the performance of the write operation that was previously suspended at a memory system;
        determine a difference between a first quantity of a first logic state stored in the page and a second quantity of the first logic state associated with an unsuspended write operation based at least in part on determining the upper limit of the threshold voltage; and
        resume the performance of the write operation based at least in part on determining the difference between the first quantity of the first logic state and the second quantity of the first logic state.

2. The apparatus of claim 1, wherein the controller is further configured to cause the apparatus to:
    identify a second indication to suspend the performance of the write operation at the memory system; and
    suspend the performance of the write operation based at least in part on identifying the indication to suspend the performance, wherein determining the upper limit is based at least in part on suspending the performance.

3. The apparatus of claim 2, wherein the second indication corresponds to a power loss.

4. The apparatus of claim 1, wherein the controller is further configured to cause the apparatus to:
    determine the page of the block at which the performance of the write operation was suspended, wherein determining the upper limit is based at least in part on determining the page.

5. The apparatus of claim 1, wherein the controller is further configured to cause the apparatus to:
determine the first quantity of the first logic state stored in the page based at least in part on determining the upper limit of the threshold voltage, wherein determining the difference is based at least in part on determining the first quantity.

6. The apparatus of claim 1, wherein the controller is further configured to cause the apparatus to:
compare the difference between the first quantity of the first logic state stored in the page and the second quantity of the first logic state associated with the unsuspended write operation with a threshold difference, wherein resuming the performance of the write operation is based at least in part on the comparison.

7. The apparatus of claim 6, wherein resuming the performance of the write operation is configured to cause the apparatus to:
determine a write voltage and a quantity of loops completed before the write operation was suspended based at least in part on the difference between the first quantity and the second quantity being less than the threshold difference.

8. The apparatus of claim 7, wherein the controller is further configured to cause the apparatus to:
determine at least one of the write voltage or the quantity of loops completed before the write operation was suspended based at least in part on reference data derived from a characterization of the memory system.

9. The apparatus of claim 7, wherein resuming the performance is further configured to cause the apparatus to:
provide the write voltage and the quantity of loops completed before the write operation was suspended to the memory system based at least in part on the difference between the first quantity and the second quantity being less than the threshold difference.

10. The apparatus of claim 7, wherein resuming the performance of the write operation is further configured to cause the apparatus to:
provide the write voltage and the quantity of loops completed before the write operation was suspended to a nonvolatile memory device of the memory system based at least in part on the difference between the first quantity and the second quantity being less than the threshold difference.

11. The apparatus of claim 7, wherein:
determining a first offset associated with the write voltage to apply in response to resuming the write operation and a second offset associated with the quantity of loops to apply in response to resuming the write operation based at least in part on the difference between the first quantity and the second quantity being less than the threshold difference; and
resuming the performance of the write operation further comprises: resuming the performance of the write operation at the page using the first offset and the second offset.

12. The apparatus of claim 11, wherein the first offset and the second offset are based on a characteristic associated with the memory system.

13. The apparatus of claim 7, wherein resuming the performance of the write operation is further configured to cause the apparatus to:
determine a third quantity of the first logic state stored in the page based at least in part on determining that a voltage is less than the upper limit of the threshold voltage based at least in part on the difference between the first quantity and the second quantity being greater than the threshold difference.

14. The apparatus of claim 13, wherein resuming the performance is further configured to cause the apparatus to:
determine a second difference between the first quantity of the first logic state stored in the page and the third quantity of the first logic state based at least in part on the difference between the first quantity and the second quantity being greater than the threshold difference.

15. A non-transitory computer-readable medium storing code, the code comprising instructions executable by a processor to:
determine an upper limit of a threshold voltage of a page of a block at which a performance of a write operation was suspended based at least in part on an indication to resume the performance of the write operation that was previously suspended at a memory system;
determine a difference between a first quantity of a first logic state stored in the page and a second quantity of the first logic state associated with an unsuspended write operation based at least in part on determining the upper limit of the threshold voltage; and
resume the performance of the write operation based at least in part on determining the difference between the first quantity of the first logic state and the second quantity of the first logic state.

16. The non-transitory computer-readable medium of claim 15, wherein the instructions are further executable by the processor to:
identify a second indication to suspend the performance of the write operation at the memory system; and
suspend the performance of the write operation based at least in part on identifying the indication to suspend the performance, wherein determining the upper limit is based at least in part on suspending the performance.

17. The non-transitory computer-readable medium of claim 16, wherein the second indication corresponds to a power loss.

18. The non-transitory computer-readable medium of claim 15, wherein the instructions are further executable by the processor to:
determine the page of the block at which the performance of the write operation was suspended, wherein determining the upper limit is based at least in part on determining the page.

19. The non-transitory computer-readable medium of claim 15, wherein the instructions are further executable by the processor to:
determine the first quantity of the first logic state stored in the page based at least in part on determining the upper limit of the threshold voltage, wherein determining the difference is based at least in part on determining the first quantity.

20. The non-transitory computer-readable medium of claim 15, wherein the instructions are further executable by the processor to:
compare the difference between the first quantity of the first logic state stored in the page and the second quantity of the first logic state associated with the unsuspended write operation with a threshold difference, wherein resuming the performance of the write operation is based at least in part on the comparison.

21. A method, comprising:
determining an upper limit of a threshold voltage of a page of a block at which a performance of a write operation was suspended based at least in part on an indication to resume the performance of the write operation that was previously suspended at a memory system;

determining a difference between a first quantity of a first logic state stored in the page and a second quantity of the first logic state associated with an unsuspended write operation based at least in part on determining the upper limit of the threshold voltage; and resuming the performance of the write operation based at least in part on determining the difference between the first quantity of the first logic state and the second quantity of the first logic state.

22. The method of claim 21, further comprising:

identifying a second indication to suspend the performance of the write operation at the memory system; and suspending the performance of the write operation based at least in part on identifying the indication to suspend the performance, wherein determining the upper limit is based at least in part on suspending the performance.

23. The method of claim 22, wherein the second indication corresponds to a power loss.

24. The method of claim 21, further comprising:

determining the page of the block at which the performance of the write operation was suspended, wherein determining the upper limit is based at least in part on determining the page.

25. The method of claim 21, further comprising:

determining the first quantity of the first logic state stored in the page based at least in part on determining the upper limit of the threshold voltage, wherein determining the difference is based at least in part on determining the first quantity.

* * * * *